United States Patent
Hwang

(10) Patent No.: US 9,640,445 B1
(45) Date of Patent: May 2, 2017

(54) METHODS OF FABRICATING SWITCHED-CAPACITOR DC-TO-DC CONVERTERS

(71) Applicant: SK hynix Inc., Gyeonggi-do (KR)

(72) Inventor: Jae Ho Hwang, Chungcheongbuk-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 15/130,806

(22) Filed: Apr. 15, 2016

(30) Foreign Application Priority Data

Dec. 16, 2015 (KR) .................. 10-2015-0180176

(51) Int. Cl.
| | |
|---|---|
| *H01L 21/82* | (2006.01) |
| *H01L 21/8238* | (2006.01) |
| *H01L 27/06* | (2006.01) |
| *H01L 23/522* | (2006.01) |
| *H01L 21/306* | (2006.01) |
| *H01L 21/683* | (2006.01) |
| *H01L 21/768* | (2006.01) |

(52) U.S. Cl.
CPC ......... *H01L 21/823871* (2013.01); *H01L 21/30625* (2013.01); *H01L 21/6835* (2013.01); *H01L 21/76831* (2013.01); *H01L 21/76877* (2013.01); *H01L 21/76898* (2013.01); *H01L 21/823807* (2013.01); *H01L 21/823878* (2013.01); *H01L 23/5223* (2013.01); *H01L 27/0629* (2013.01); *H01L 2221/68327* (2013.01)

(58) Field of Classification Search
CPC .......... H01L 27/0629; H01L 21/28008; H01L 21/3065

See application file for complete search history.

(56) References Cited

U.S. PATENT DOCUMENTS

| | | |
|---|---|---|
| 6,707,090 B2 | 3/2004 | Gonzalez et al. |
| 7,005,329 B2 | 2/2006 | Shin |
| 7,825,446 B2* | 11/2010 | Takahashi ......... H01L 21/76829 257/278 |
| 2003/0052352 A1* | 3/2003 | Soeda ................. H01L 23/5225 257/296 |

(Continued)

*Primary Examiner* — Caridad Everhart
*Assistant Examiner* — Ankush Singal
(74) *Attorney, Agent, or Firm* — IP & T Group LLP

(57) ABSTRACT

A method of fabricating a switched-capacitor converter includes providing a semiconductor layer having a top surface and a bottom surface, forming switching elements on the top surface of the semiconductor layer, forming a first insulation layer and first interconnection patterns on the switching elements, forming a second insulation layer over the first insulation layer and the first interconnection patterns, forming a second interconnection pattern over the second insulation layer, forming a third insulation layer over the second insulation layer and the second interconnection pattern, forming third interconnection patterns and a lower interconnection pattern over the bottom surface of the semiconductor layer, forming a capacitor over the lower interconnection pattern, forming a fourth insulation layer over the bottom surface of the semiconductor layer to expose an upper electrode pattern of the capacitor, forming a fifth insulation layer covering the capacitor, and forming pads in the fifth insulation layer.

18 Claims, 10 Drawing Sheets

(56) References Cited

U.S. PATENT DOCUMENTS

| | | | |
|---|---|---|---|
| 2004/0139693 A1* | 7/2004 | Lamers | G07D 11/0096 53/67 |
| 2009/0212391 A1* | 8/2009 | Carobolante | H01L 23/642 257/531 |
| 2009/0243039 A1* | 10/2009 | Kim | H01L 21/76852 257/532 |
| 2010/0032803 A1* | 2/2010 | Lippitt, III | H01L 23/5223 257/534 |
| 2010/0065944 A1* | 3/2010 | Tu | H01L 23/5223 257/532 |
| 2011/0018095 A1 | 1/2011 | Booth, Jr. et al. | |
| 2011/0215390 A1* | 9/2011 | Kim | H01L 29/861 257/306 |
| 2011/0284991 A1* | 11/2011 | Hijioka | H01L 23/5223 257/532 |
| 2012/0306029 A1* | 12/2012 | Maki | H01L 27/1108 257/412 |
| 2013/0242643 A1* | 9/2013 | Kim | G11C 5/14 365/149 |
| 2015/0061742 A1* | 3/2015 | Maehashi | H03K 3/012 327/213 |
| 2016/0020270 A1* | 1/2016 | Kim | H02M 3/07 257/296 |
| 2016/0276270 A1* | 9/2016 | Iwasaki | H01L 23/5256 |
| 2017/0019024 A1* | 1/2017 | Hwang | H02M 3/158 |

* cited by examiner

METHODS OF FABRICATING SWITCHED-CAPACITOR DC-TO-DC CONVERTERS

CROSS-REFERENCE TO RELATED APPLICATIONS

The present application claims priority under 35 U.S.C 119(a) to Korean Patent Application No. 10-2015-0180176, filed on Dec. 16, 2015, which is herein incorporated by references in its entirety.

BACKGROUND

1. Technical Field

Various embodiments of the present disclosure relate to methods of fabricating converters and, more particularly, to methods of fabricating switched-capacitor Direct Current-to-Direct Current (DC-to-DC) converters.

2. Related Art

Switched power converters used in power supplies may include switched-inductor converters (SICs) and switched-capacitor converters (SCCs). The SICs may store energy in their inductors and convert a source of direct current (DC) from one voltage level into another voltage level. The SCCs may store energy in their capacitors and convert a source of direct current (DC) from one voltage level into another voltage level. The SICs may exhibit a wide operating range and a high efficiency. Thus, the SICs have been widely used in a high power device. However, there may be some limitations in employing the SICs in compact systems since inductors of the SICs occupy a relatively large area. In contrast, the SCCs may be suitable for low power systems having a compact size since capacitors of the SICs occupy a relatively small area as compared with the inductors of the SICs. Recently, the SCCs have been widely used in mobile systems due to their compact size and low electromagnetic interference. In general, when switching elements and capacitors are integrated in a single chip, there may be a limitation in increasing a capacitance value of the capacitors due to a limited area assigned for capacitors.

SUMMARY

Various embodiments are directed to methods of fabricating a switched-capacitor DC-to-DC converter.

According to one embodiment, there is provided a method of fabricating a switched-capacitor DC-to-DC converter. The method includes providing a semiconductor layer having a top surface and a bottom surface, forming a plurality of switching elements on the top surface of the semiconductor layer and in a bulk region of the semiconductor layer, forming a first insulation layer and first interconnection patterns over the top surface of the semiconductor layer, forming a second insulation layer over the first insulation layer and the first interconnection patterns, forming a second interconnection pattern connected to the first interconnection patterns over the second insulation layer, forming a third insulation layer over the second insulation layer and the second interconnection pattern, forming third interconnection patterns and a lower interconnection pattern over the bottom surface of the semiconductor layer, forming a capacitor over the lower interconnection pattern, forming a fourth insulation layer over the bottom surface of the semiconductor layer to cover the third interconnection patterns and to expose an upper electrode pattern of the capacitor, forming a fifth insulation layer over the fourth insulation layer to cover the capacitor, and forming a plurality of pads in the fifth insulation layer. The third interconnection patterns and the lower interconnection pattern are electrically connected to the first interconnection patterns.

BRIEF DESCRIPTION OF THE DRAWINGS

Various embodiments of a present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "under," "beneath," "below," "lower," "on," "over," "above," "upper," "side" or "aside" another element, it can be directly contact the other element, or at least one intervening element may also be present therebetween. Accordingly, the terms such as "under," "beneath," "below," "lower," "on," "over," "above," "upper," "side," "aside" and the like which are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
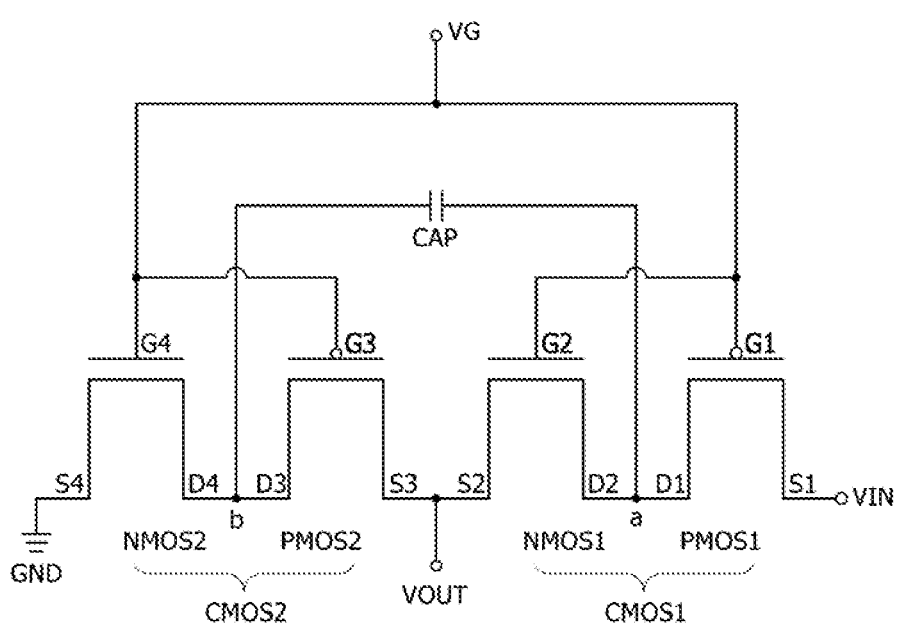
FIG. 1 is a circuit diagram illustrating a switched-capacitor DC-to-DC converter according to an embodiment.

FIG. 1 is a circuit diagram illustrating a switched-capacitor DC-to-DC converter 10 according to an embodiment. Referring to FIG. 1, the switched-capacitor DC-to-DC converter 10 may be configured to include a first CMOS inverter CMOS1, a second CMOS inverter CMOS2, and a capacitor CAP.

The first CMOS inverter CMOS1 may include a first P-channel MOS transistor PMOS1 and a first N-channel MOS transistor NMOS1. The second CMOS inverter CMOS2 may include a second P-channel MOS transistor PMOS2 and a second N-channel MOS transistor NMOS2. The first P-channel MOS transistor PMOS1 may have a source terminal S1 corresponding to a P-type source region and a drain terminal D1 corresponding to a P-type drain region. The second P-channel MOS transistor PMOS2 may have a source terminal S3 corresponding to a P-type source region and a drain terminal D3 corresponding to a P-type drain region.

The first N-channel MOS transistor NMOS1 may have a source terminal S2 corresponding to an N-type source region and a drain terminal D2 corresponding to an N-type drain region. The second N-channel MOS transistor NMOS2 may have a source terminal S4 corresponding to an N-type source region and a drain terminal D4 corresponding to an N-type drain region.

The source terminal S1 and the drain terminal D1 of the first P-channel MOS transistor PMOS1 may be connected to an input voltage terminal VIN and the drain terminal D2 of the first N-channel MOS transistor NMOS1, respectively. The source terminal S2 of the first N-channel MOS transistor NMOS1 may be connected to an output voltage terminal VOUT.

The source terminal S3 and the drain terminal D3 of the second P-channel MOS transistor PMOS2 may be connected to the output voltage terminal VOUT and the drain terminal D4 of the second N-channel MOS transistor NMOS2, respectively. The source terminal S4 of the second N-channel MOS transistor NMOS2 may be connected to a ground terminal GND.

A first terminal of both terminals of the capacitor CAP may be connected to a first output node "a" of the first CMOS inverter CMOS1. A second terminal of the capacitor CAP may be connected to a second output node "b" of the second CMOS inverter CMOS2. The first output node "a" may be coupled to the drain terminal D1 of the first P-channel MOS transistor PMOS1 and the drain terminal D2 of the first N-channel MOS transistor NMOS1. The second output node "b" may be coupled to the drain terminal D3 of the second P-channel MOS transistor PMOS2 and the drain terminal D4 of the second N-channel MOS transistor NMOS2.

Gate terminals G1 and G2 of the first P-channel MOS transistor PMOS1 and the first N-channel MOS transistor NMOS1 as well as gate terminals G3 and G4 of the second P-channel MOS transistor PMOS2 and the second N-channel MOS transistor NMOS2 may be connected to a gate voltage input terminal VG in common.

The switched capacitor DC-to-DC converter 10 according to the present embodiment may function as a DC-to-DC converter that converts a source of direct current (DC) from one voltage level to another voltage level via two operation steps, for example, a charging step and a discharging step. During the operation of the switched capacitor DC-to-DC converter 10, a clock signal may be inputted to the switched capacitor DC-to-DC converter 10 through the gate voltage input terminal VG.

Specifically, in the charging step, a gate voltage signal which is lower than a certain voltage level such as, a threshold voltage of the first and second N-channel MOS transistors NMOS1 and NMOS2, for example, a gate voltage signal having a ground voltage level, may be applied to the gate voltage input terminal VG. Accordingly, while the first and second P-channel MOS transistors PMOS1 and PMOS2 are turned on, the first and second N-channel MOS transistors NMOS1 and NMOS2 may be turned off.

In such a case, a current path may be formed between the input voltage terminal VIN and the output voltage terminal VOUT through the first output node "a", the capacitor CAP, and the second output node "b". The capacitor CAP may be charged to store a certain amount of electric charges therein when an input voltage signal is applied to the input voltage terminal VIN.

In the discharging step, a gate voltage signal which is higher than a certain voltage level such as, a threshold voltage of the first and second N-channel MOS transistors NMOS1 and NMOS2, for example, a gate voltage signal of 5 volts, may be applied to the gate voltage input terminal VG. Accordingly, while the first and second N-channel MOS transistors NMOS1 and NMOS2 are turned on, the first and second P-channel MOS transistors PMOS1 and PMOS2 may be turned off.

In such a case, both terminals of the capacitor CAP may be connected to the ground terminal GND and the output voltage terminal VOUT, respectively. Thus, the charged capacitor CAP may serve as a voltage source and output a voltage having a level different from the input voltage signal through the output voltage terminal VOUT.

Figure 2:
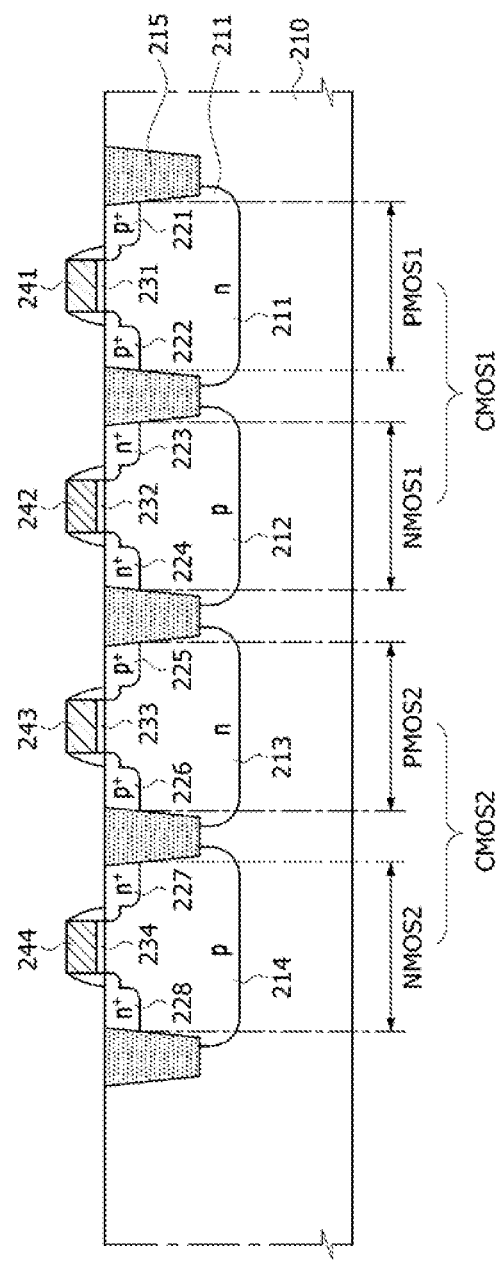
FIG. 2 is a cross-sectional view illustrating a method of forming switching elements employed in a switched-capacitor DC-to-DC converter according to an embodiment.

FIGS. 2 to 10 illustrate a method of fabricating a switched-capacitor DC-to-DC converter according to an embodiment. Specifically, FIG. 2 is a cross-sectional view illustrating a method of forming switching elements employed in a switched-capacitor DC-to-DC converter according to an embodiment. Referring to FIG. 2, a logic structure may be provided. The logic structure may include a plurality of switching elements integrated in a semiconductor layer 210.

The semiconductor layer 210 may be a semiconductor substrate or a junction region formed in a semiconductor substrate. In some embodiments, the semiconductor layer 210 may be a single crystalline silicon layer. In some embodiments, the semiconductor layer 210 may be a silicon epitaxial layer. The semiconductor layer 210 may have a thickness of about 4 micrometers.

The plurality of switching elements may include a first P-channel MOS transistor PMOS1, a first N-channel MOS transistor NMOS1, a second P-channel MOS transistor PMOS2, and a second N-channel MOS transistor NMOS2. As described with reference to FIG. 1, the first P-channel MOS transistor PMOS1 and the first N-channel MOS transistor NMOS1 may constitute a first CMOS inverter CMOS1, and the second P-channel MOS transistor PMOS2 and the second N-channel MOS transistor NMOS2 may constitute a second CMOS inverter CMOS2.

To form the plurality of switching elements, a first N-well region 211 and a second N-well region 213 may be formed in the semiconductor layer 210. In the first N-well region 211, the first P-channel MOS transistor PMOS1 is formed. In the second N-well region 213, the second P-channel MOS transistor PMOS2 is formed.

Additionally, a first P-well region 212 and a second P-well region 214 may be formed in the semiconductor layer 210. In the first P-well region 212, the first N-channel MOS transistor NMOS1 is formed. In the second P-well region 214, the second N-channel MOS transistor NMOS2 is formed.

The first N-well region 211 and the second N-well region 213 may be formed by implanting N-type impurities into the semiconductor layer 210. The first P-well region 212 and the second P-well region 214 may be formed by implanting P-type impurities into the semiconductor layer 210. In some embodiments, the first N-well region 211 and the second N-well region 213 may be formed after the first P-well region 212 and the second P-well region 214 are formed. Alternatively, the first P-well region 212 and the second P-well region 214 may be formed after the first N-well region 211 and the second N-well region 213 are formed.

A trench isolation layer 215 may be formed in an upper region of the semiconductor layer 210 to define a plurality of active regions. The plurality of active regions may be defined in upper regions of the first N-well region 211, the first P-well region 212, the second N-well region 213 and the second P-well region 214, respectively. A first gate stack, a second gate stack, a third gate stack and a fourth gate stack may be formed on the active regions, respectively.

The first gate stack may be formed to include a first gate insulation layer 231 and a first gate electrode 241 which are sequentially stacked on the active region defined in the first N-well region 211. The second gate stack may be formed to include a second gate insulation layer 232 and a second gate electrode 242 which are sequentially stacked on the active region defined in the first P-well region 212. The third gate stack may be formed to include a third gate insulation layer 233 and a third gate electrode 243 which are sequentially stacked on the active region defined in the second N-well region 213. The fourth gate stack may be formed to include a fourth gate insulation layer 234 and a fourth gate electrode 244 which are sequentially stacked on the active region defined in the second P-well region 214.

In some embodiments, the first to fourth gate insulation layers 231~234 may be formed of a silicon oxide layer. In some embodiments, the first to fourth gate electrodes 241~244 may be formed of a polysilicon layer.

Gate spacers may be formed on sidewalls of the first to fourth gate stacks. Before the gate spacers are formed, P-type impurities may be implanted into the first and second N-type well regions 211 and 213 to form P-type source/drain regions having a lightly doped drain (LDD) structure. N-type impurities may be implanted into the first and second P-type well regions 212 and 214 to form N-type source/drain regions having a lightly doped drain (LDD) structure.

After the gate spacers are formed, P-type impurities may be additionally implanted into the first and second N-type well regions 211 and 213 to form a P-type source region 221 and a P-type drain region 222 which are disposed in upper regions of the first N-type well region 211 and to form a P-type source region 225 and a P-type drain region 226 which are disposed in upper regions of the second N-type well region 213.

Moreover, after the P-type source regions 221 and 225 and the P-type drain regions 222 and 226 are formed, N-type impurities may be additionally implanted into the first and second P-type well regions 212 and 214 to form an N-type source region 224 and an N-type drain region 223 which are disposed in upper regions of the first P-type well region 212 and to form an N-type source region 228 and an N-type drain region 227 which are disposed in upper regions of the second P-type well region 214.

In some embodiments, the ion implantation process for forming the N-type source regions 224 and 228 and the N-type drain regions 223 and 227 may be performed before the ion implantation process for forming the P-type source regions 221 and 225 and the P-type drain regions 222 and 226 is performed.

Figure 3:
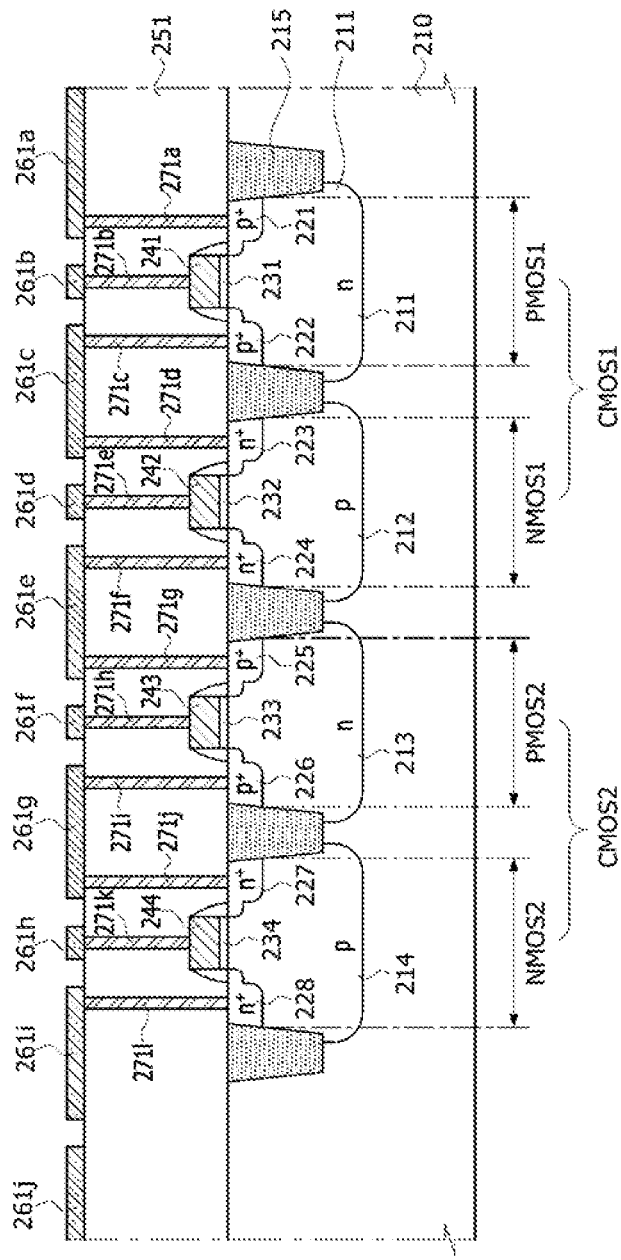
FIG. 3 is a cross-sectional view illustrating a method of forming first interconnection patterns employed in a switched-capacitor DC-to-DC converter according to an embodiment.

FIG. 3 is a cross-sectional view illustrating a method for forming first interconnection patterns 261a~261j employed in a switched-capacitor DC-to-DC converter according to an embodiment. Referring to FIG. 3, a first insulation layer 251 may be formed on the semiconductor layer 210 to cover the MOS transistors PMOS1, NMOS1, PMOS2 and NMOS2. A plurality of vias 271a~271l may be formed in the first insulation layer 251. The plurality of vias 271a~271l may penetrate the first insulation layer 251.

The first interconnection patterns 261a~261j may be formed on the first insulation layer 251. The first interconnection patterns include primary first interconnection pattern 261a, secondary first interconnection pattern 261i, tertiary first interconnection pattern 261e, quaternary first interconnection pattern 261j, quinary first interconnection pattern 261c, and senary first interconnection pattern 261g. The primary first interconnection pattern 261a may be electrically connected to the P-type source region 221 of the first P-channel MOS transistor PMOS1 through the via 271a. The secondary first interconnection pattern 261i may be electrically connected to the N-type source region 228 of the second N-channel MOS transistor NMOS2 through the via 271l. The tertiary first interconnection pattern 261e may be electrically connected to the N-type source region 224 of the first N-channel MOS transistor NMOS1 and the P-type source region 225 of the second P-channel MOS transistor PMOS2 through the vias 271f and 271g. The quaternary first interconnection pattern 261j may be a pattern for electrically connecting the tertiary first interconnection pattern 261e to an output voltage terminal VOUT through vias which are formed in subsequent processes. Thus, the quaternary first interconnection pattern 261j is not connected to any other elements at this stage. The quinary first interconnection pattern 261c may be electrically connected to the P-type drain region 222 of the first P-channel MOS transistor PMOS1 and the N-type drain region 223 of the first N-channel MOS transistor NMOS1 through the vias 271c and 271d. The senary first interconnection pattern 261g may be electrically connected to the P-type drain region 226 of the second P-channel MOS transistor PMOS2 and the N-type drain region 227 of the second N-channel MOS transistor NMOS2 through the vias 271i and 271j.

The first interconnection pattern 261b may be electrically connected to the first gate electrode 241 of the first P-channel MOS transistor PMOS1 through the via 271b. The first interconnection pattern 261d may be electrically connected to the second gate electrode 242 of the first N-channel MOS transistor NMOS1 through the via 271e. The first interconnection pattern 261f may be electrically connected to the third gate electrode 243 of the second P-channel MOS transistor PMOS2 through the via 271h. The first interconnection pattern 261h may be electrically connected to the fourth gate electrode 244 of the second N-channel MOS transistor NMOS2 through the via 271k.

Figure 4:
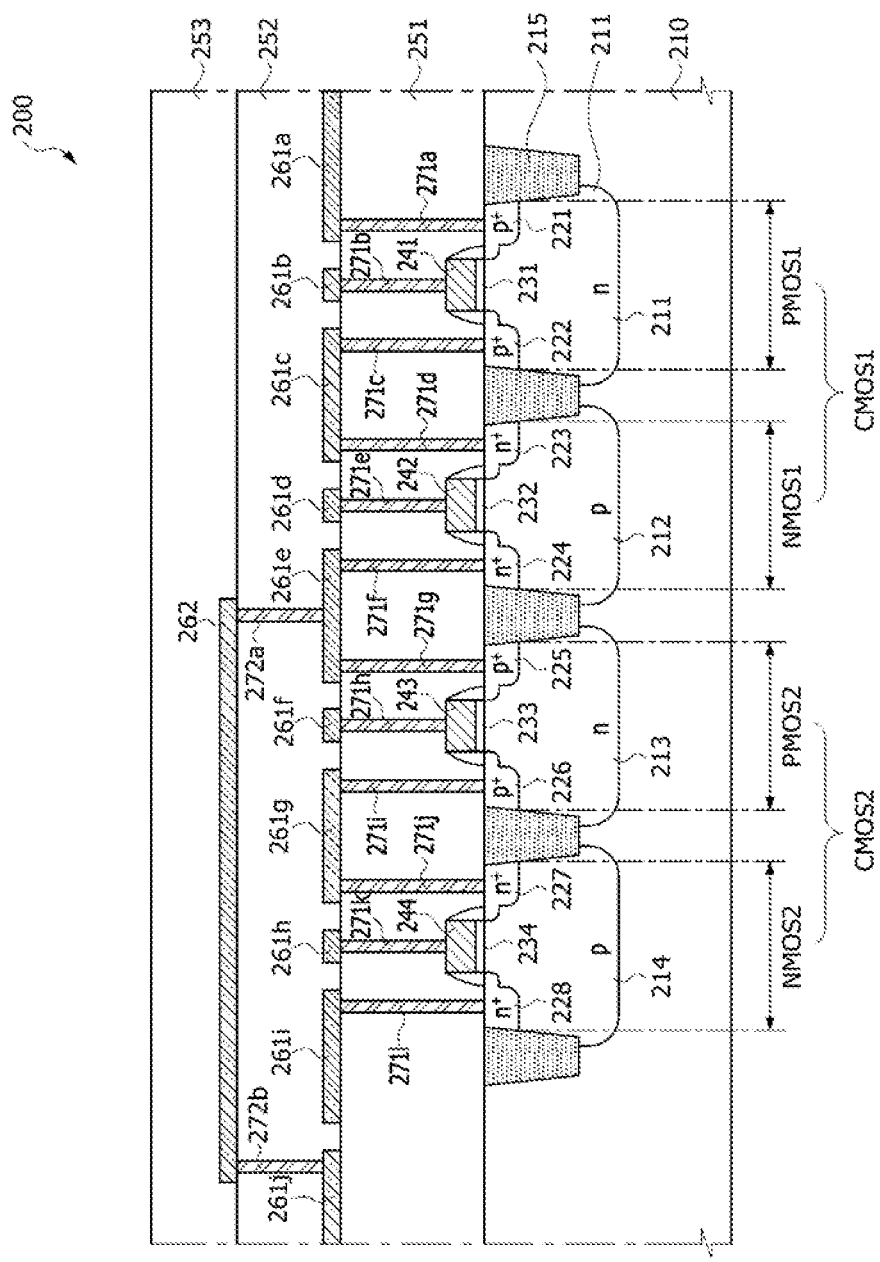
FIG. 4 is a cross-sectional view illustrating a method of forming a second interconnection pattern employed in a switched-capacitor DC-to-DC converter according to an embodiment.

FIG. 4 is a cross-sectional view illustrating a method of forming a second interconnection pattern 262 employed in a switched-capacitor DC-to-DC converter according to an embodiment. Referring to FIG. 4, a second insulation layer 252 may be formed on the first insulation layer 251 and the first interconnection patterns 261a~261j. A plurality of vias 272a and 272b may be formed in the second insulation layer 252. The plurality of vias 272a and 272b may penetrate the second insulation layer 252.

The second interconnection pattern 262 may be formed on the second insulation layer 252. The second interconnection pattern 262 may be formed to electrically connect the tertiary first interconnection pattern 261e to the quaternary first interconnection pattern 261j through the vias 272a and 272b. Accordingly, the quaternary first interconnection pattern 261j may be electrically connected to the N-type source region 224 of the first N-channel MOS transistor NMOS1 and the P-type source region 225 of the second P-channel MOS transistor PMOS2 through the vias 271f, 271g, 272a and 272b, the tertiary first interconnection pattern 261e, and the second interconnection pattern 262.

Although only the second interconnection pattern 262 is illustrated in FIG. 4, at least one additional second interconnection pattern may be shown in another cross-sectional view taken along a different portion. For example, while the second interconnection pattern 262 is formed, a couple of second interconnection patterns may also be formed on the second insulation layer 252 to electrically connect the quinary first interconnection pattern 261c and the senary first interconnection pattern 261g to both terminals of a capacitor which will be formed in subsequent processes respectively.

A third insulation layer 253 may be formed on the second insulation layer 252 and the second interconnection pattern 262. The first, second and third insulation layers 251, 252 and 253 may be formed of the same insulation layer, for example, an oxide layer. However, in some embodiments, the first, second and third insulation layers 251, 252 and 253 may be formed of insulation layers different from the others. In some embodiments, the first, second and third insulation layers 251, 252 and 253 may be formed of a single-layered insulation layer or a multi-layered insulation layer.

By the processes described above, a logic structure 200 may be formed on the semiconductor layer 210. That is, the logic structure 200 may include the first CMOS inverter CMOS1 comprised of the first P-channel MOS transistor PMOS1 and the first N-channel MOS transistor NMOS1 and the second CMOS inverter CMOS2 comprised of the second P-channel MOS transistor PMOS2 and the second N-channel MOS transistor NMOS2. According to the method described above, the logic structure 200 may be formed using a general CMOS process without any complicated processes such as through silicon via (TSV) techniques.

Figure 5:
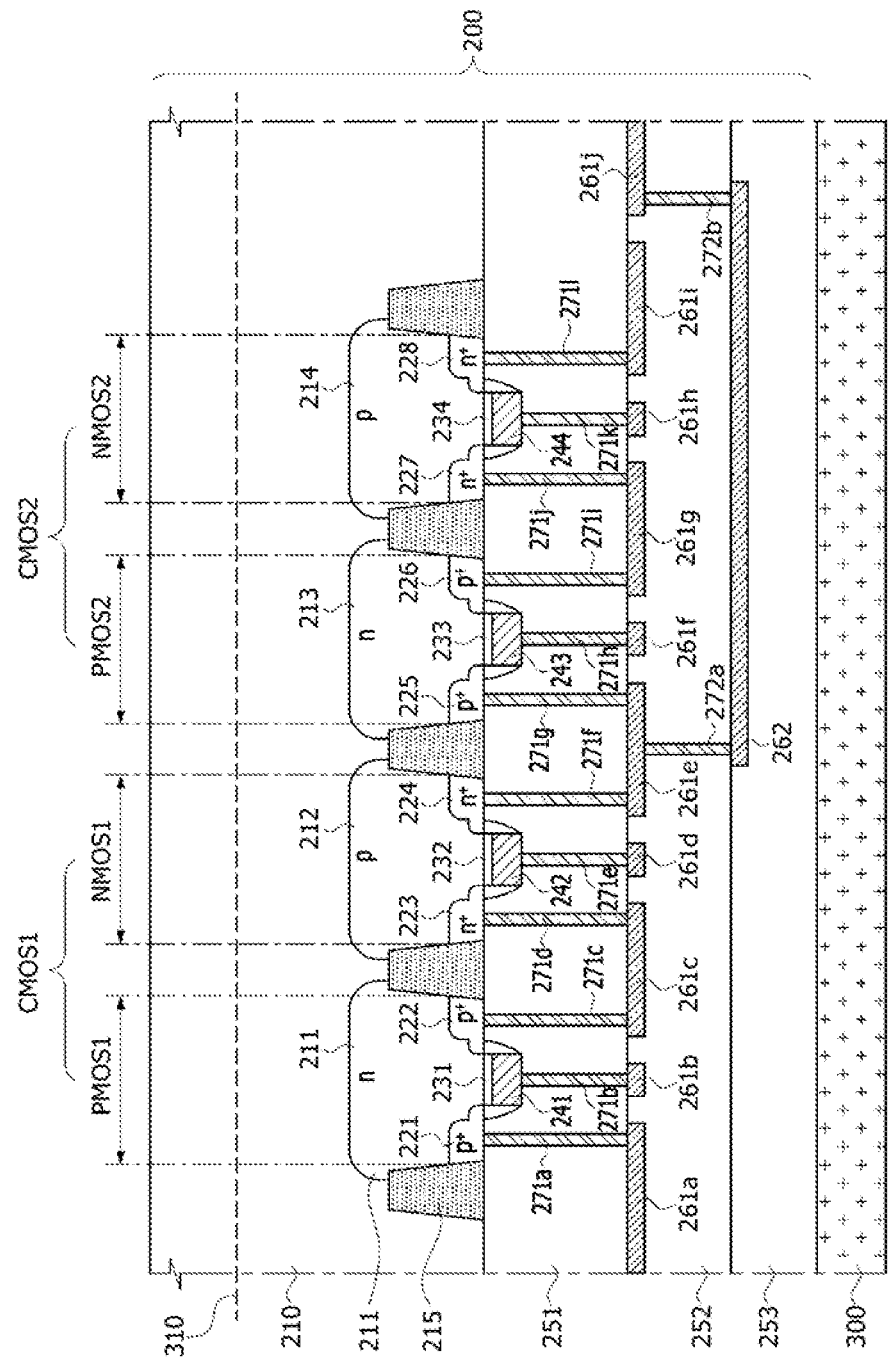
FIG. 5 is a cross-sectional view illustrating a method of attaching a handling substrate used in fabrication of a switched-capacitor DC-to-DC converter according to an embodiment.

FIG. 5 is a cross-sectional view illustrating a method of attaching a handling substrate 300 used in fabrication of a switched-capacitor DC-to-DC converter according to an embodiment. Referring to FIG. 5, the handling substrate 300 may be attached to the logic structure 200 described with reference to FIG. 4.

Specifically, the handling substrate 300 may be attached to a top surface of the third insulation layer 253, and the logic structure 200 may be flipped so that the handling substrate 300 is located below the logic structure 200. Subsequently, the semiconductor layer 210 may be planarized to reduce a thickness thereof, as indicated by a dotted line 310. The planarization process may be performed using a chemical mechanical polishing (CMP) technique. The planarization process may be performed so that the semiconductor layer 210 has a final thickness of about 2.5 micrometers. In some embodiments, the handling substrate 300 may be comprised of an oxide-based material. Alternatively, the handling substrate 300 may have a multi-layered structure including an oxide-based layer.

Figure 6:
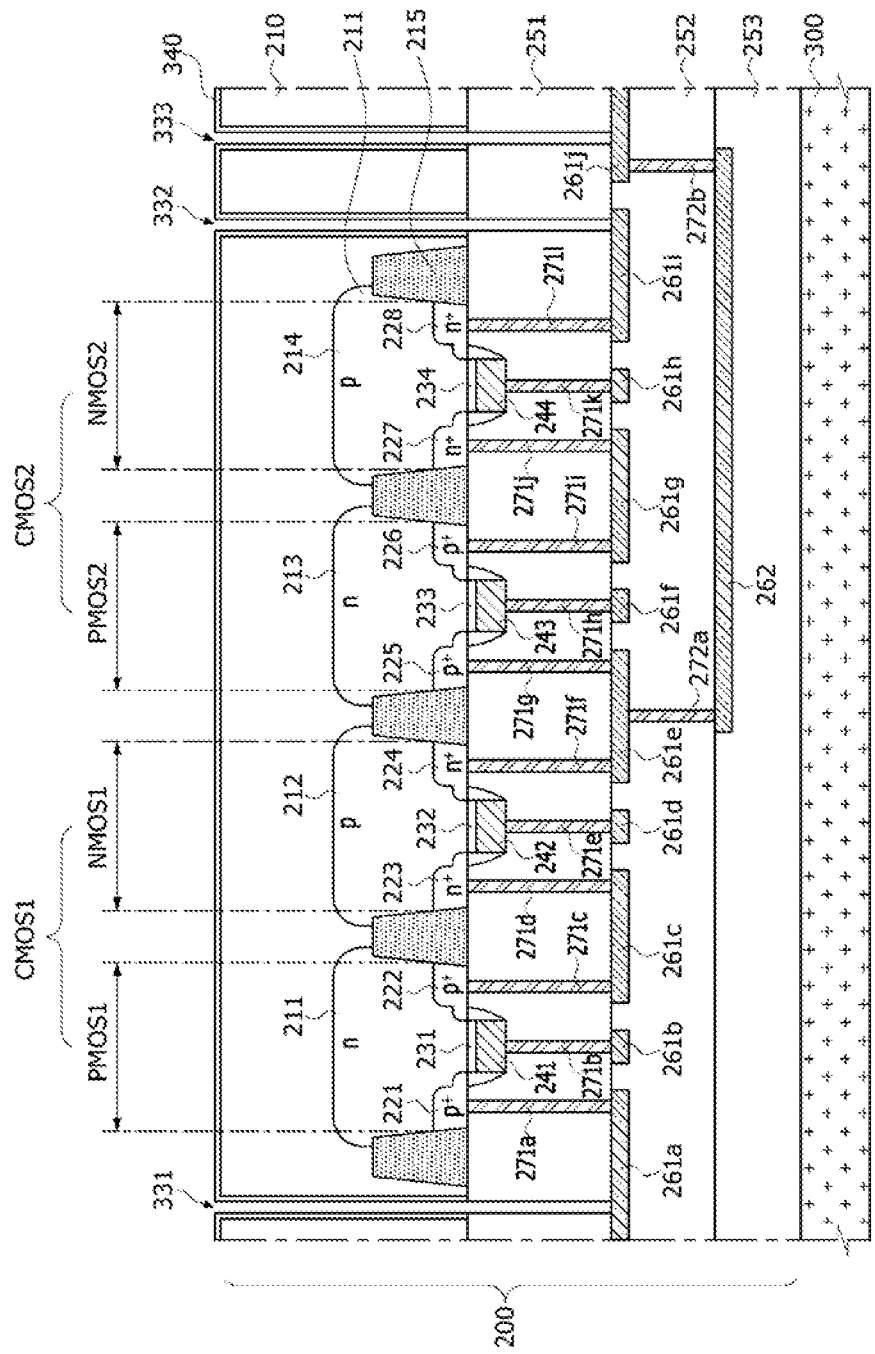
FIG. 6 is a cross-sectional view illustrating a method of forming first to third via holes employed in a switched-capacitor DC-to-DC converter according to an embodiment.

FIG. 6 is a cross-sectional view illustrating a method of forming first to third via holes 331, 332 and 333 employed in a switched-capacitor DC-to-DC converter according to an embodiment. Referring to FIG. 6, the semiconductor layer 210 and the first insulation layer 251 may be patterned to form the first via hole 331 exposing the primary first interconnection pattern 261a, the second via hole 332 exposing the secondary first interconnection pattern 261i, and the third via hole 333 exposing the quaternary first interconnection pattern 261j. The first to third via holes 331, 332 and 333 may be formed wider in the semiconductor layer 210 than in the first insulation layer 251 due to an etch difference between the semiconductor layer 210 and the first insulation layer 251.

An insulation layer 340 may be formed on sidewalls of the first to third via holes 331, 332 and 333 in the semiconductor layer 210 and on a top surface of the semiconductor layer 210. The insulation layer 340 may be formed of an oxide layer or an oxide/nitride/oxide (ONO) layer. Although not shown in the drawings, if a couple of additional second interconnection patterns are formed to electrically connect the first interconnection patterns 261c and 261g to both terminals of a capacitor which is formed in subsequent processes respectively, additional via holes exposing the couple of additional second interconnection patterns may also be formed while the first to third via holes 331, 332 and 333 are formed.

Figure 7:
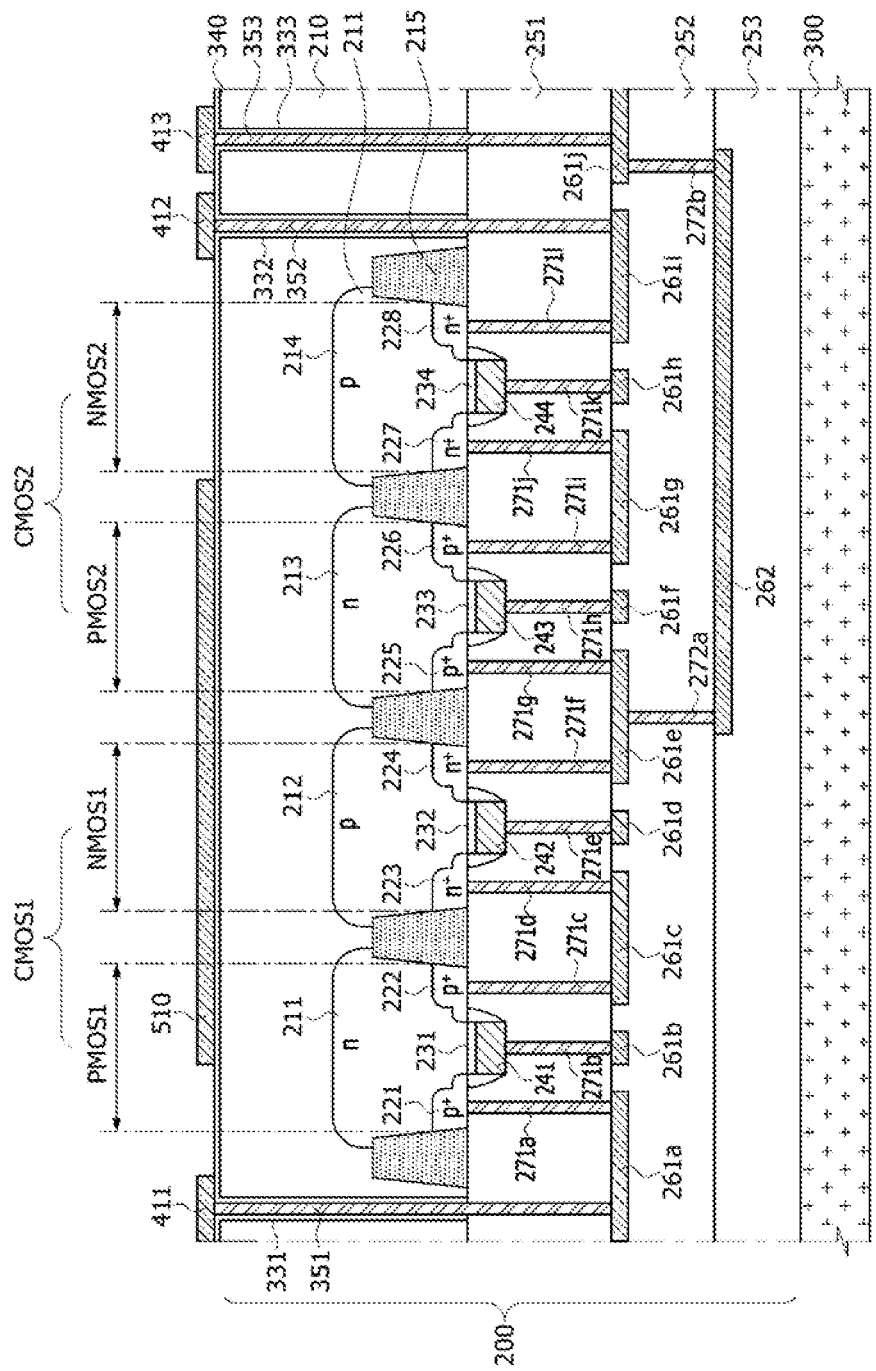
FIG. 7 is a cross-sectional view illustrating a method of forming first to third vias, third interconnection patterns, and a lower interconnection pattern employed in a switched-capacitor DC-to-DC converter according to an embodiment.

FIG. 7 is a cross-sectional view illustrating a method of forming first to third vias 351, 352 and 353, third interconnection patterns 411, 412 and 413, and a lower interconnection pattern 510 employed in a switched-capacitor DC-to-DC converter according to an embodiment. Referring to FIG. 7, first to third via holes 331, 332 and 333 may be filled with a conductive material to form the first via 351, the second via 352 and the third via 353.

Each of the first to third vias 351, 352 and 353 may have a double layered structure including a barrier metal layer and a metal layer. In some embodiments, the metal layer of the first to third vias 351, 352 and 353 may be formed of a tungsten (W) layer, an aluminum (Al) layer or a tungsten/aluminum (W/Al) layer. The first via 351 may be electrically connected to the first interconnection pattern 261a, and the second via 352 may be electrically connected to the first interconnection pattern 261i. In addition, the third via 353 may be electrically connected to the first interconnection pattern 261j.

The third interconnection patterns 411, 412 and 413 may be formed on the first to third vias 351, 352 and 353, respectively. The third interconnection patterns includes primary third interconnection pattern 411, secondary third interconnection pattern 412, and tertiary third interconnection pattern 413. The lower interconnection pattern 510 may also be formed on the insulation layer 340 while the third interconnection patterns 411, 412 and 413 are formed. The primary third interconnection pattern 411 may be electrically connected to the primary first interconnection pattern 261a through the first via 351, and the secondary third interconnection pattern 412 may be electrically connected to the secondary first interconnection pattern 261i through the second via 352. Moreover, the tertiary third interconnection pattern 413 may be electrically connected to the quaternary first interconnection pattern 261j through the third via 353.

The lower interconnection pattern 510 may be formed on the insulation layer 340 spaced apart from each of the third interconnection patterns 411, 412 and 413. Although not shown in the drawings, the lower interconnection pattern 510 may be electrically connected to the quinary first interconnection patterns 261c through a via penetrating the insulation layer 340, the semiconductor layer 210 and the first insulation layer 251.

Figure 8:
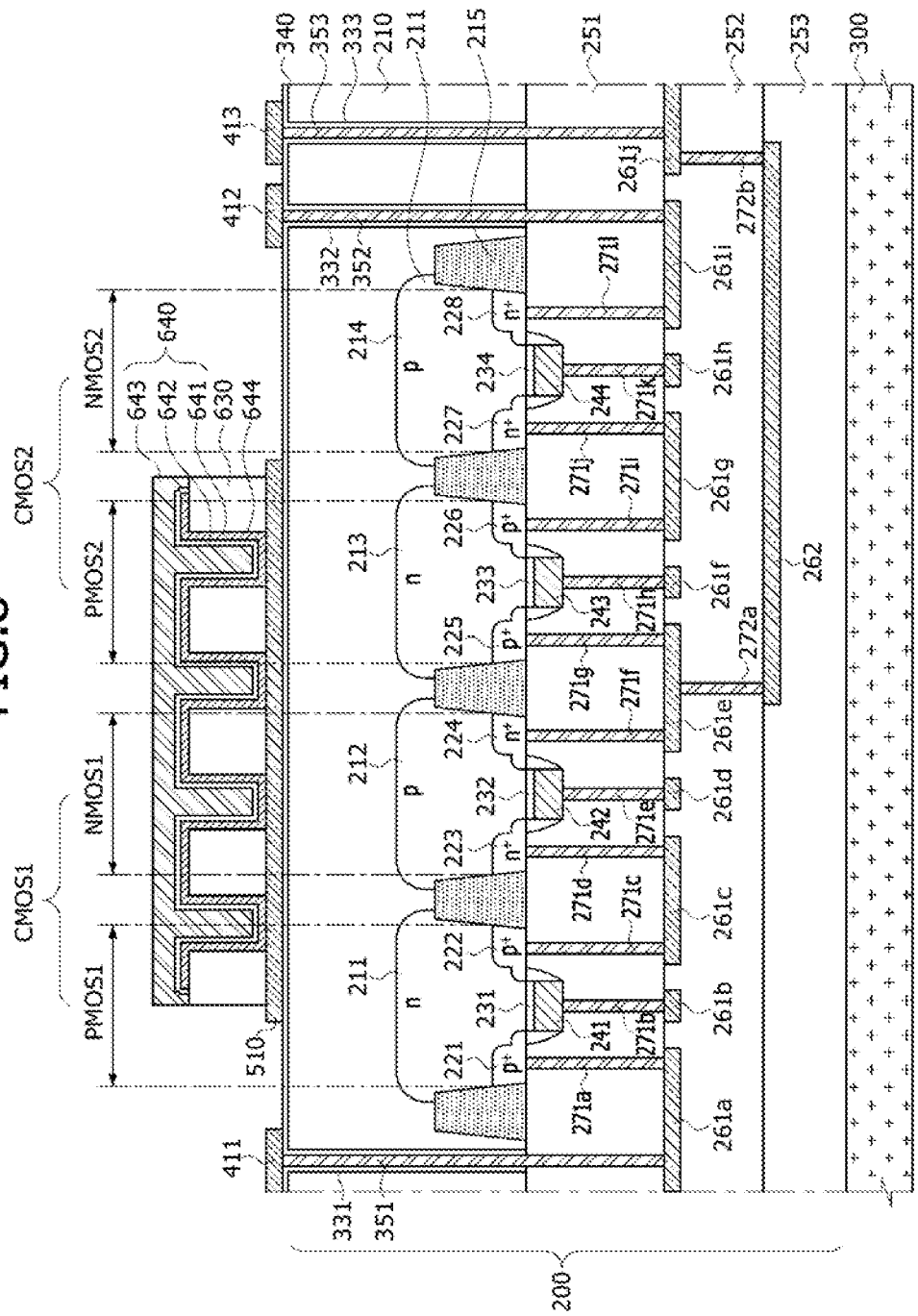
FIGS. 8 and 9 are respectively a cross-sectional view and a plan view illustrating a method of forming a capacitor employed in a switched-capacitor DC-to-DC converter according to an embodiment.
Figure 9:
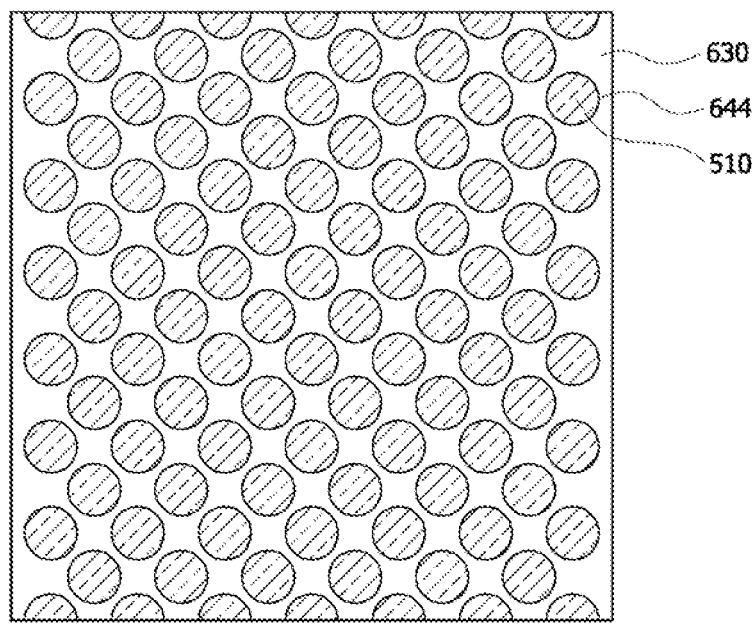

FIGS. 8 and 9 are respectively a cross-sectional view and a plane view illustrating a method of forming a capacitor 640 employed in a switched-capacitor DC-to-DC converter according to an embodiment. Referring to FIG. 8, the capacitor 640 may be formed on the lower interconnection pattern 510.

In the present embodiment, the capacitor 640 may be formed to vertically overlap with the logic structure 200. In such a case, a planar area occupied by the switched-capacitor DC-to-DC converter may be reduced. That is, a capacitance value of the capacitor 640 per unit planar area of the switched-capacitor DC-to-DC converter may increase since the capacitor 640 is formed to vertically overlap with the logic structure 200.

To form the capacitor 640, a dummy insulation pattern 630 may be formed on the lower interconnection pattern 510. In some embodiments, the dummy insulation pattern 630 may be formed of a single oxide layer or a plurality of insulation layers. The dummy insulation pattern 630 may be formed to have a plurality of contact holes 644 therein. The contact holes 644 may penetrate the dummy insulation pattern 630 to expose portions of the lower interconnection pattern 510.

As illustrated in a plane view of FIG. 9, the contact holes 644 may be spaced apart from each other by a certain distance. In some embodiments, the contact holes 644 may be located at central points and vertices of a plurality of hexagons constituting a honeycomb structure in a plan view.

Referring again to FIG. 8, a lower electrode pattern 641 may be formed on portions of the lower interconnection pattern 510 exposed by the contact holes 644, sidewalls of the dummy insulation pattern 630 exposed by the contact holes 644, and a top surface of the dummy insulation pattern 630. In some embodiments, the lower electrode pattern 641 may be formed of a single metal layer or a metal compound layer such as a tantalum nitride (TaN) layer or a titanium nitride (TiN) layer. The lower electrode pattern 641 may be formed to expose edges of the top surface of the dummy insulation pattern 630. The exposed edges of the dummy insulation pattern 630 may have a certain width along a perimeter of the dummy insulation pattern 630.

A dielectric pattern 642 may be formed on the lower electrode pattern 641. In some embodiments, the dielectric pattern 642 may be formed of a high-k dielectric layer, for example, a silicon nitride (SiN) layer, an aluminum oxide ($Al_2O_3$) layer, a tantalum pentoxide ($Ta_2O_5$) layer, a zirconium oxide ($ZrO_2$) layer or a hafnium oxide ($HfO_2$) layer. Alternatively, the dielectric pattern 342 may be formed of a high-k dielectric layer comprised of a composite layer such as a $ZrO_2/Al_2O_3/ZrO_2$ layer.

An upper electrode pattern 643 may be formed on the dielectric pattern 642. The upper electrode pattern 643 may be formed to fill the contact holes 644. In some embodiments, the upper electrode pattern 643 may be formed of a single metal layer or a metal compound layer such as a tantalum nitride (TaN) layer or a titanium nitride (TiN) layer.

The lower electrode pattern 641, the dielectric pattern 642 and the upper electrode pattern 643 may constitute the capacitor 640. Each of the lower electrode pattern 641, the dielectric pattern 642 and the upper electrode pattern 643 may be formed to overlap with the top surface of the dummy insulation pattern 630, the sidewalls of the contact holes 644, and bottom surfaces of the contact holes 644. Thus, a capacitance value of the capacitor 640 may increase.

Figure 10:
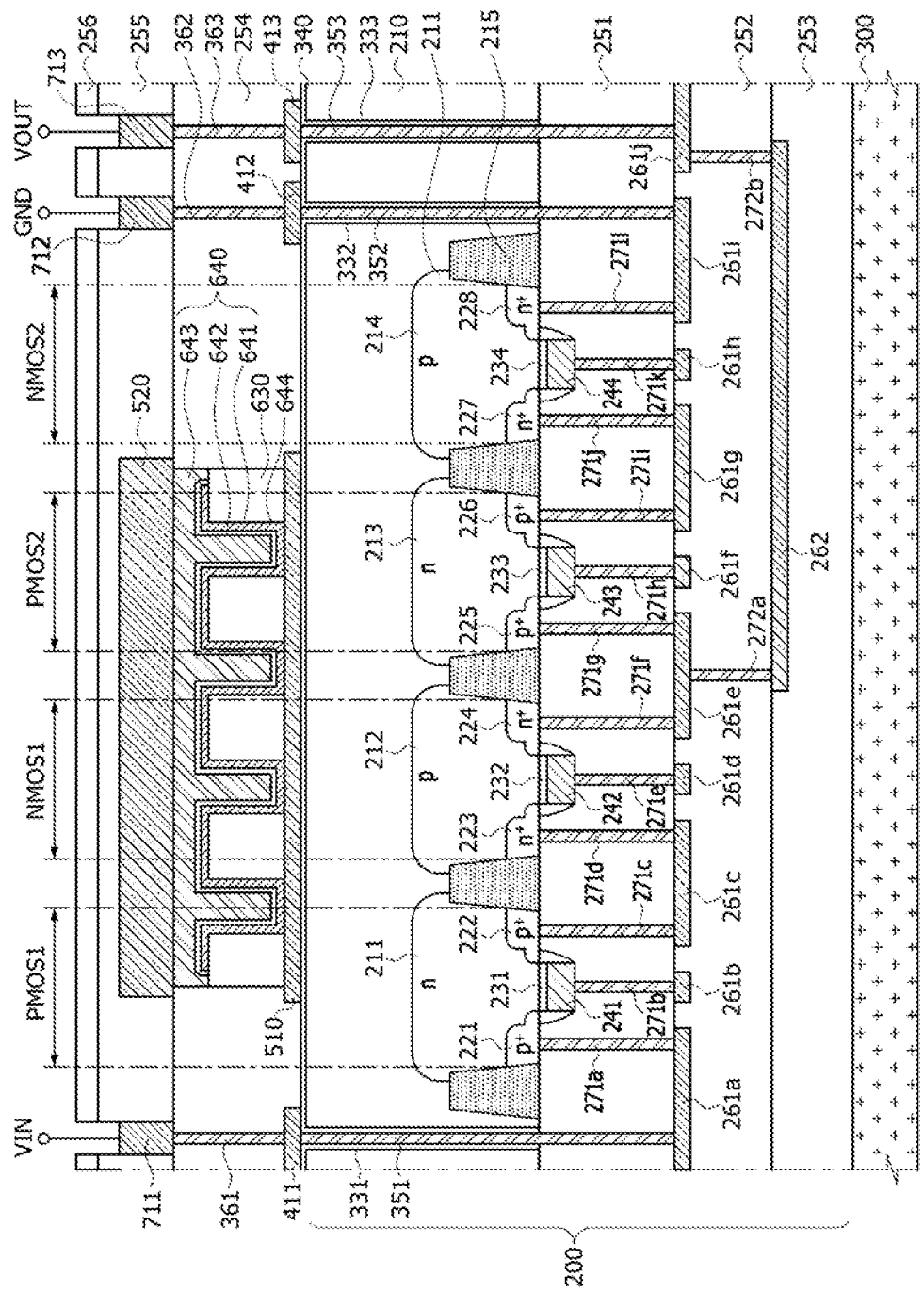
FIG. 10 is a cross-sectional view illustrating a method of forming fourth to sixth vias, an upper interconnection pattern, and first to third pads employed in a switched-capacitor DC-to-DC converter according to an embodiment.

FIG. 10 is a cross-sectional view illustrating a method of forming fourth to sixth vias 361, 362 and 363, an upper interconnection pattern 520, and first to third pads 711, 712 and 713 employed in a switched-capacitor DC-to-DC converter according to an embodiment. Referring to FIG. 10, a fourth insulation layer 254 may be formed on the insulation layer 340 and the third interconnection patterns 411, 412 and 413 to expose a top surface of the upper electrode pattern 643 of the capacitor 640.

The fourth insulation layer 254 may be patterned to form via holes exposing the third interconnection patterns 411, 412 and 413. The via holes may be filled with a conductive material such as a metal material to form the fourth to sixth vias 361, 362 and 363. The fourth via 361 may be electrically connected to the third interconnection pattern 411, and the fifth via 362 may be electrically connected to the third interconnection pattern 412. Moreover, the sixth via 363 may be electrically connected to the third interconnection pattern 413.

The upper interconnection pattern 520 may be formed on the upper electrode pattern 643. Although not shown in the drawings, the upper interconnection pattern 520 may be electrically connected to the senary first interconnection pattern 261g. A fifth insulation layer 255 may be formed on the fourth insulation layer 254, the fourth to sixth vias 361, 362 and 363, and the upper interconnection pattern 520. A passivation layer 256 may be formed on the fifth insulation layer 255. The passivation layer 256 and the fifth insulation layer 255 may be patterned to form via holes exposing the fourth to sixth vias 361, 362 and 363. The via holes may be filled with a metal layer to form a first pad 711 connected to the fourth via 361, a second pad 712 connected to the fifth via 362, and a third pad 713 connected to the sixth via 363.

The first pad 711 may be electrically connected to an input voltage terminal VIN, the second pad 712 may be electrically connected to a ground terminal GND, and the third pad 713 may be electrically connected to an output voltage terminal VOUT. As described with reference to FIG. 1, the input voltage terminal VIN may be electrically connected to the source terminal S1 of the first P-channel MOS transistor PMOS1. Accordingly, the first pad 711 coupled to the input voltage terminal VIN may be electrically connected to the P-type source region 221 through the fourth via 361, the primary third interconnection pattern 411, the first via 351, the primary first interconnection pattern 261a and the via 271a.

Moreover, the ground terminal GND may be electrically connected to the source terminal S4 of the second N-channel MOS transistor NMOS2. Accordingly, the second pad 712 coupled to the ground terminal GND may be electrically connected to the N-type source region 228 through the fifth via 362, the secondary third interconnection pattern 412, the second via 352, the secondary first interconnection pattern 261i and the via 271l. In addition, the output voltage terminal VOUT may be electrically connected to the source terminal S2 of the first N-channel MOS transistor NMOS1 and the source terminal S3 of the second P-channel MOS transistor PMOS2. Accordingly, the third pad 713 coupled to the output voltage terminal VOUT may be electrically connected to the N-type source region 224 and the P-type source region 225 through the sixth via 363, the tertiary third interconnection pattern 413, the third via 353, the tertiary first interconnection pattern 261e and the quaternary first interconnection pattern 261j, and the vias 271g and 271f.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A method of fabricating a switched-capacitor DC-to-DC converter, the method comprising:
   providing a semiconductor layer having a top surface and a bottom surface;
   forming a plurality of switching elements on the top surface of the semiconductor layer and in a bulk region of the semiconductor layer;
   forming a first insulation layer and first interconnection patterns over the top surface of the semiconductor layer;
   forming a second insulation layer over the first insulation layer and the first interconnection patterns;
   forming a second interconnection pattern connected to the first interconnection patterns and provided over the second insulation layer;
   forming a third insulation layer over the second insulation layer and the second interconnection pattern;
   forming third interconnection patterns and a lower interconnection pattern over the bottom surface of the semiconductor layer;
   forming a capacitor over the lower interconnection pattern;
   forming a fourth insulation layer over the bottom surface of the semiconductor layer to cover the third interconnection patterns and to expose an upper electrode pattern of the capacitor;
   forming a fifth insulation layer over the fourth insulation layer to cover the capacitor; and
   forming a plurality of pads in the fifth insulation layer,
   wherein the third interconnection patterns and the lower interconnection pattern are electrically connected to the first interconnection patterns.

2. The method of claim 1, wherein forming the plurality of switching elements includes:
   forming a first P-channel MOS transistor and a first N-channel MOS transistor constituting a first CMOS inverter; and
   forming a second P-channel MOS transistor and a second N-channel MOS transistor constituting a second CMOS inverter.

3. The method of claim 2,
   wherein the first interconnection patterns includes primary, secondary, and tertiary first interconnection patterns,
   wherein the primary first interconnection pattern is electrically connected to a source region of the first P-channel MOS transistor,
   wherein the secondary first interconnection pattern is electrically connected to a source region of the second N-channel MOS transistor, and
   wherein the tertiary first interconnection pattern is electrically connected to a source region of the first N-channel MOS transistor and a source region of the second P-channel MOS transistor.

4. The method of claim 3,
   wherein the first interconnection patterns further includes a quaternary first interconnection pattern, and
   wherein the quaternary first interconnection pattern is insulated from the first and second CMOS inverters.

5. The method of claim 4,
   wherein the second interconnection pattern is electrically connected to the quaternary first interconnection pattern and the tertiary first interconnection pattern.

6. The method of claim 5, further comprising:
   applying a planarization process to the bottom surface of the semiconductor layer to reduce a thickness of the semiconductor layer before the third interconnection patterns and the lower interconnection pattern are formed.

7. The method of claim 6,
   wherein the planarization process is performed using a chemical mechanical polishing (CMP) technique.

8. The method of claim 6, further comprising:
   attaching a handling substrate to the third insulation layer before the planarization process is applied to the bottom surface of the semiconductor layer.

9. The method of claim 8,
   wherein the handling substrate includes an oxide layer.

10. The method of claim 5, wherein forming the third interconnection patterns and the lower interconnection pattern is preceded by:
    forming a first via hole penetrating the semiconductor layer and the first insulation layer to expose the primary first interconnection pattern;
    forming a second via hole penetrating the semiconductor layer and the first insulation layer to expose the secondary first interconnection pattern;
    forming a third via hole penetrating the semiconductor layer and the first insulation layer to expose the quaternary first interconnection pattern;
    forming an insulation layer over sidewalls of the first, the second, and the third via holes and over the bottom surface of the semiconductor layer; and
    filling the first, the second, and the third via holes with a conductive layer to form a first via, a second via, and a third via, respectively.

11. The method of claim 10,
    wherein the third interconnection patterns includes primary, secondary, tertiary third interconnection patterns,
    wherein the primary third interconnection pattern is formed over the first via and is in contact with the first via,
    wherein the secondary third interconnection pattern is formed over the second via and is in contact with the second via, and
    wherein the tertiary third interconnection pattern is formed over the third via and is in contact with the third via.

12. The method of claim 11,
    wherein the lower interconnection pattern and the third interconnection patterns are formed over the insulation layer, and
    wherein the lower interconnection pattern is spaced apart from the third interconnection patterns.

13. The method of claim 12,
    wherein the first interconnection patterns further includes quinary first interconnection pattern,
    wherein the quinary first interconnection pattern is connected to a drain region of the first P-channel MOS transistor and a drain region of the first N-channel MOS transistor, and
    wherein the lower interconnection pattern is electrically connected to the quinary first interconnection pattern through a via penetrating the insulation layer, the semiconductor layer, and the first insulation layer.

14. The method of claim 13, wherein forming the capacitor over the lower interconnection pattern includes:
    forming a dummy insulation pattern having a plurality of contact holes over the lower interconnection pattern;

forming a lower electrode pattern over the lower interconnection pattern exposed by the contact holes and over the dummy insulation pattern;

forming a dielectric layer over the lower electrode pattern; and forming the upper electrode pattern over the dielectric layer.

15. The method of claim 14, wherein forming the fifth insulation layer is preceded by:

patterning the fourth insulation layer to form fourth, fifth, and sixth via holes exposing the third interconnection patterns;

forming fourth, fifth, and sixth vias in the fourth, the fifth, and the sixth via holes, respectively; and forming an upper interconnection pattern over the exposed upper electrode pattern.

16. The method of claim 15, wherein forming the plurality of pads includes:

patterning the fifth insulation layer to form via holes exposing the fourth, the fifth, and the sixth vias; and filling the via holes with a metal layer to form the plurality of pads.

17. The method of claim 16, wherein the first interconnection patterns further includes senary first interconnection patterns, wherein the senary first interconnection pattern is connected to a drain region of the second P-channel MOS transistor and a drain region of the second N-channel MOS transistor, and wherein the upper interconnection pattern is electrically connected to the senary first interconnection pattern.

18. The method of claim 16, wherein the plurality of pads includes first, second, and third pads, wherein the first pad is electrically connected to an input voltage terminal, wherein the second pad is electrically connected to a ground terminal, and wherein the third pad is electrically connected to an output voltage terminal.

* * * * *